United States Patent [19]

Ramsey, Jr. et al.

[11] 4,423,375

[45] Dec. 27, 1983

[54] SELF-ALIGNED LIGHT LOAD ADJUSTMENT ASSEMBLY FOR INDUCTION METERS

[75] Inventors: James E. Ramsey, Jr., Raleigh; Auburn K. Griffin, Jr., Sanford, both of N.C.

[73] Assignee: Westinghouse Electric Corp., Pittsburgh, Pa.

[21] Appl. No.: 272,246

[22] Filed: Jun. 10, 1981

[51] Int. Cl.³ .............................................. G01R 11/02
[52] U.S. Cl. .................................................. 324/137
[58] Field of Search ................ 324/136, 137, 138, 139

[56] References Cited

U.S. PATENT DOCUMENTS 2,352,965  7/1944  Mendelsohn ...................... 324/138
4,213,090  7/1980  Keever et al. ..................... 324/138

FOREIGN PATENT DOCUMENTS 867571  2/1953  Fed. Rep. of Germany.
2356132  5/1975  Fed. Rep. of Germany.
483022  12/1969  Switzerland.
582561  11/1946  United Kingdom.

*Primary Examiner*—Gerard R. Strecker
*Assistant Examiner*—Warren S. Edmonds

[57] ABSTRACT

The present invention is for an induction meter having a voltage and a current magnetic section. The voltage magnetic section is comprised of a substantially E-shaped laminated magnetic core having a center leg terminating at a main pole face and two adjacent legs terminating at coplanar auxiliary pole faces on opposite sides of the main pole face, and includes a spacer bracket located between a first side of the voltage magnetic core and a first voltage shunting member. The spacer bracket carries a self-aligned, light load adjustment assembly having a movable tab extending over portions of one of the auxiliary pole faces and the main pole face thereby providing an adjustable magnetic flux shunt path. A second voltage shunting member is located in magnetic proximity to the first side of the core and spaced from the first voltage shunting member by a nonmagnetic spacer. The second voltage shunting member has a fixed tab in magnetic proximity to the other auxiliary pole face and a fixed tab in magnetic proximity to the movable tab. In this manner, the first voltage shunting member, the second voltage shunting member and the movable tab all provide magnetic flux shunt paths.

8 Claims, 3 Drawing Figures

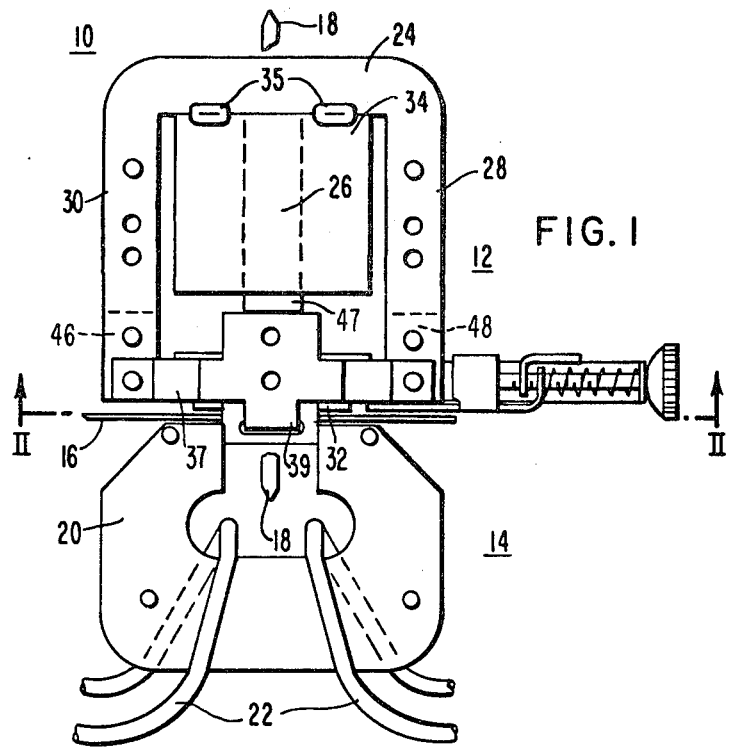
FIG. 1
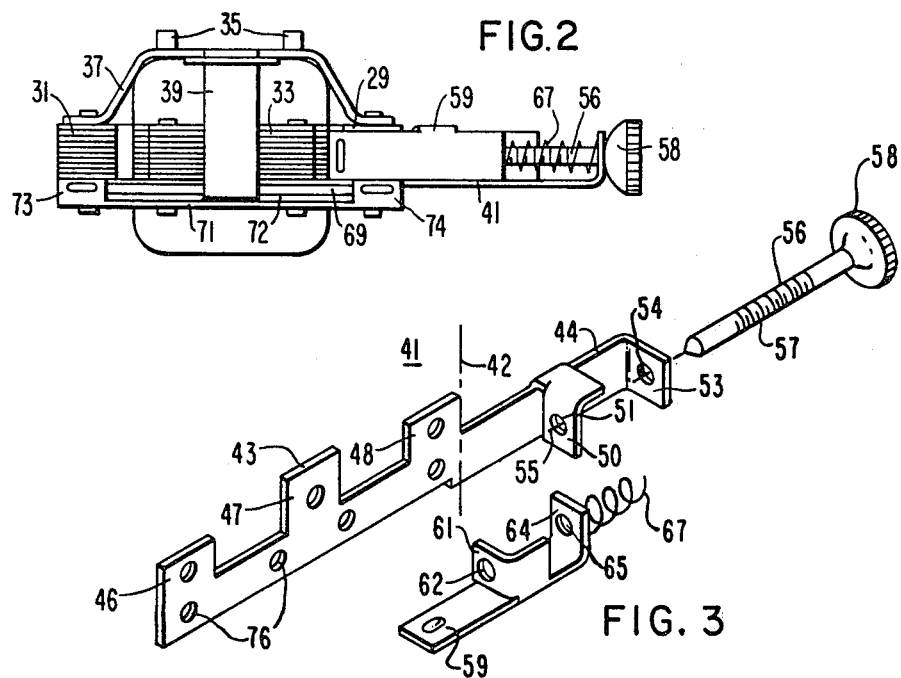
FIG. 2
FIG. 3

SELF-ALIGNED LIGHT LOAD ADJUSTMENT ASSEMBLY FOR INDUCTION METERS

BACKGROUND OF THE INVENTION

1. Field of the Invention

This invention relates to induction meters having an electromagnetic assembly including a voltage magnetic section and a current magnetic section and more particularly to the voltage magnetic section of such a meter having an integral, self-aligned light load adjustment assembly.

2. Description of the Prior Art

Induction meters such as watthour meters are almost universally used for billing and load monitoring of AC electric energy transmitted by an electric energy supplier to residential and commercial electricity users. Voltage and current magnetic sections which comprise the meter's electromagnetic assembly produce magnetic fluxes responsive to line voltage and line current. The magnetic fluxes are directed into an electroconductive disk which rotates in response to the consumption of AC electric energy. In the manufacture and design of watthour meter electromagnetic assemblies, it is known to provide adjustments on the voltage magnetic section so that the voltage and current fluxes rotate the disk at a calibrated rate or speed having a predetermined ratio to the consumption of electric energy as measured in kilowatt hours. The ratio of the disk speed to the measure electric energy is often referred to as the watthour constant of the meter.

Correction and adjustment of the power factor or voltage flux phase lag and light load characteristics are two common calibrating adjustments of induction watthour meters. The calibrations are used to provide operation in accordance with the well-known basic theory of operation of induction watthour meters which includes the principle that the magnetic flux from the voltage section, being responsive to the line voltage, must lag the magnetic flux from the current section, being responsive to the line current, by ninety electrical degrees when the line voltage and current are in phase at unity power factor. In modern watthour meters, the voltage and current fluxes are directed in this quadrature phase relationship in opposing directions into an airgap and into opposite sides of the meter disk which is located in the airgap. The fluxes produce eddy currents in localized areas of the disk. In accordance with the aforementioned basic theory, interaction of the eddy currents with the voltage and current magnetic fluxes develops a torque on the meter disk in proportion to the measured electrical energy.

The voltage magnetic section typically has an E-shaped magnetic core carrying a coil having a large number of winding turns of a small conductor on the center leg thereof. The voltage coil has substantial inductance so that the voltage airgap flux produced by the coil will substantially lag the line voltage, but not by the required ninety degrees without further adjustment. To provide the additional flux lagging adjustment, it is known to provide a loop of conductive material around the voltage flux so that circulating current is induced therein to establish a further voltage flux component that is vectorially added to the voltage coil main flux component to produce a corrected working voltage flux in the airgap. The resultant airgap voltage flux has substantially the aforementioned ninety degrees or quadrature lagging relationship with the line voltage and current flux at unity power factor.

Light load adjustment differs from the phase lag adjustment so that at low values of line current an asymmetrical component of voltage flux will add torque to the meter disk. A part of the light load adjustment compensates for the slight frictional drag on the shaft which carries the meter disk and another part compensates for the non-linear and lower permeability characteristics of the laminated magnetic core materials at low magnetic induction causing the line current related flux to be disproportionately low. Compensation and calibration of the light load adjustment in the voltage magnetic section of some electromagnetic assemblies is related to the regulation of the disk torque produced by the magnetic drive effects of an asymmetrical voltage flux path established between the main center voltage pole face and a pair of auxiliary voltage pole faces. A secondary voltage flux path is divided and extends between the disk and the pair of auxiliary voltage pole faces formed at the free ends of the opposite legs of the E-shaped voltage core on opposite sides of the main voltage pole face. The secondary flux path produces a large magnetic flux shunting path to carry the leakage or the non-driving component of the voltage flux. A light load adjuster is described in U.S. Pat. No. 2,947,942 which includes two magnetic members movable over the auxiliary pole faces. The magnetic members produce dissymmetry in the disk driving flux by producing effects in the driving flux path in a predetermined adding or subtracting relationship (depending on the position) to the main driving torque on the disk. The magnetic members are movably mounted on a brass bracket fastened to the meter electromagnetic assembly. The bracket also carries a threaded adjusting member to move the magnetic members.

In U.S. Pat. No. 3,493,862, a light load adjuster is described including soft magnetic members carried by a nonmagnetic bracket. The magnetic members are pivotally mounted on the brackets so that the ends of the members extend over the faces of the voltage flux arms to vary light load calibrations. U.S. Pat. No. 4,213,090, is for a voltage magnetic section of a watthour meter having a voltage flux lagging loop formed integrally with a platform part directly attached to the voltage magnetic core. Light load adjustment members are movably mounted on the platform which also carries a manual operator for shifting the light load members to a predetermined position for proper operation in the meter.

SUMMARY OF THE PRESENT INVENTION

In accordance with the present invention an induction meter includes an electromagnetic assembly having a current magnetic section and a voltage magnetic section each producing magnetic flux in response to line current and line voltage, respectively. An electroconductive disk is driven at a rate responsive to the magnetic flux directed from the magnetic sections. The voltage magnetic section is comprised of a substantially E-shaped laminated magnetic core having a center leg terminating at a main pole face and two adjacent legs terminating at coplanar auxiliary pole faces on opposite sides of the main pole face. A first and a last laminae define a first and a second side, respectively of the core. A voltage coil is wound about the center leg of the voltage core.

A first voltage shunting member is located in magnetic proximity to the first side. A nonmagnetic spacer is located between the first side of the voltage core and the first voltage shunting member. A portion of the nonmagnetic spacer extends beyond the first side of the voltage core and has two perpendicular extensions carrying a screw. A movable tab has a threaded portion cooperating with the screw and is oriented so as to extend over portions of one of the auxiliary pole faces and the main pole face thereby providing an adjustable magnetic flux shunt path.

A second voltage shunting member has a first fixed tab in magnetic proximity to the other auxiliary pole face and a second fixed tab in magnetic proximity to the movable tab. A second nonmagnetic spacer is located between the first and second voltage shunting members. The first and second voltage shunting members provide magnetic flux shunt paths between the main pole face and the auxiliary pole faces. The first and second voltage shunting members, the first and second nonmagnetic spacers, as well as the laminae of the magnetic voltage core all have corresponding openings therethrough such that the components of the voltage magnetic section may be riveted together, thereby providing a solid assembly.

Completing the description of the induction meter, a power factor bracket extends from the second side of the voltage core. A flux return tongue is carried by the power factor bracket and located opposite the main pole face a predetermined space therefrom. The electroconductive disk rotates in the space between the power factor bracket and the main pole face.

BRIEF DESCRIPTION OF THE DRAWINGS

FIG. 1 is a front elevational view of an electromagnetic assembly of an induction meter including a current magnetic section and a voltage magnetic section having a fixed light load adjustment assembly constructed according to the teachings of the present invention;

FIG. 2 is across sectional view of FIG. 1 taken along the axis II—II and looking in the direction of the voltage magnetic section; and FIG. 3 is a perspective view with parts exploded, of a fixed light load adjustment assembly.

DESCRIPTION OF THE PREFERRED EMBODIMENT

Referring to FIG. 1, there is shown an electromagnetic assembly of a single phase induction watthour meter 10 for measuring the electric energy transmitted from an electric energy supplier to a customer thereof. While the following description is made in conjunction with the induction watthour meter 10, the teachings of the present invention need not be limited thereto. The present invention is equally applicable to multi-phase meters, and to induction meters capable of measuring quantities other than watthours.

The single stator electromagnetic assembly of the meter 10 includes a voltage magnetic section 12 and a current magnetic section 14 carried by a frame (not shown). An electroconductive disk 16 is carried by a shaft 18 (partially shown) for rotation in a predetermined gap between the voltage and current magnetic sections 12 and 14, respectively.

The current magnetic section 14 is comprised of a laminated C-shaped magnetic core 20 and current coils 22 formed of a large diameter conductor. The current coils 22 are connectable in a conventional manner in series with an AC line current component of an electrical energy quantity to be measured.

The voltage magnetic section 12 is comprised of an E-shaped laminated magnetic core 24 having a center leg 26, a first adjacent leg 28 terminating in a first auxiliary pole face 29 (shown in FIG. 2) and a second adjacent leg 30 terminating in a second auxiliary pole face 31 (shown in FIG. 2). The first and second adjacent legs 28 and 30, respectively, are disposed on opposite sides of the center leg 26. The first and second auxiliary pole faces 29 and 31, respectively, are coplanar. The center leg 26 cooperates with an expanded laminated magnetic pole piece having a first portion (not visible) substantially colinear with the center leg 26 and a second portion 32 substantially perpendicular to the center leg 26. The second portion 32 terminates in a main pole face 33 (shown in FIG. 2). The center leg 26 carries a voltage coil 34 enclosed within a protective encapsulating material and having terminals 35 connectable in a conventional manner to an AC line voltage component of the electric energy quantity to be measured.

When the voltage coil 34 and the current coils 22 are properly energized from the AC line voltage and current components, respectively, of the AC electric energy quantity to be measured, the main pole face 33 of the E-shaped magnetic core 24 and one of the pole faces of the C-shaped magnetic core 20 become sources of magnetic flux. A working voltage flux component and a working current flux component flow from the respective pole faces into the airgap and into the disk 16. The working airgap voltage and current fluxes produce eddy currents in the disk 16 which interact with the fluxes to develop a resultant torque acting to drive the disk 16 and the shaft 18. The torque on the disk 16 produces a rate of rotation or speed that is dependent upon the product of the AC line voltage and current components and the phase angle therebetween. The rotation of the disk 16 and shaft 18 may be employed in a suitable manner for indicating the measured electric energy such as by a dial register (not shown) connected to the shaft 18. Such measurement is well known and does not form an important feature of the present invention.

Turning now to a more detailed description of the voltage magnetic section 12, the first and last laminae of the magnetic core 24 define a first and a second side, respectively. The view in FIG. 1 is of the second side. As shown in FIG. 1, the second side of the magnetic core 24 has a power factor bracket 37 extending therefrom. The power factor bracket 37 carries a flux return tongue 39. The flux return tongue 39 is located opposite the main pole face 33 with a predetermined spaced relationship therebetween as can be seen in FIG. 1. The electroconductive disk 16 rotates in the predetermined space. The power factor bracket 37 and the flux return tongue 39 provide a magnetic flux path for returning voltage magnetic flux to the core 24.

The components adjacent to the first side of the voltage core 24 are shown in FIG. 2. A nonmagnetic, multifunction support and spacer bracket 41 is located adjacent the first side of the voltage core 24 and is shown in FIG. 2. The spacer bracket 41, shown in detail in FIG. 3, is divided by the broken line 42 into a first portion 43 and a second portion 44. The first portion 43 of the spacer bracket 41 is oriented so as to have one edge substantially coplanar with the auxiliary pole faces 29 and 31. The first portion 43 has three perpendicular extensions 46, 47 and 48 giving the first portion 43 an E-shape. The first perpendicular extension 46 corresponds to the second adjacent leg 30; the second and third perpendicular extensions 47 and 48 correspond to the center leg 26 and the first adjacent leg 28, respectively. The second portion 44 of the spacer bracket 41 extends beyond the first adjacent leg 28.

The second portion 44 of the spacer bracket 41 has a first perpendicular extension 50 having an opening 51 therethrough and a second perpendicular extension 53 having an opening 54 therethrough. Each of the openings 51 and 54 is unthreaded. The openings 51 and 54 are concentric as shown by the broken line 55. A screw 56 extends through the unthreaded openings 51 and 54 such that the screw is carried by the first and second perpendicular extensions 50 and 53. The screw 56 has a threaded portion 57 which is located between the first and second perpendicular extensions 50 and 53, respectively. The screw 56 also has a head 58.

A movable tab or slider 59 has a first perpendicular extension 61 having an unthreaded opening 62 therethrough and a second perpendicular extension 64 having a threaded opening 65 therethrough. The openings 62 and 65 are concentric such that the movable tab 59 is carried by the screw 56. The threaded opening 65 cooperates with the threaded portion 57 of the screw such that the position of the movable tab 59 may be varied. By turning the screw 56, the movable tab 59 extends over adjustable portions of the main pole face 33 and the first auxiliary pole face 29. In this manner, the spacer bracket 41 carries a fixed, self-aligned light load adjuster assembly providing an adjustable shunt path for magnetic flux between the aforementioned pole faces.

Concluding the description of FIG. 3, a spring 67 is carried by the screw 56 and is located between the second perpendicular extension 64 of the movable tab 59 and the second perpendicular extension 53 of the second portion 44 of the spacer bracket 41. The spring 67 is in various stages of compression depending upon the location of the movable tab 59. The spring 67 provides a force upon the movable tab 59 so as to prevent undesirable movement of the tab 59.

Returning to FIG. 2, a first voltage shunting member 69 is located in magnetic proximity with the main pole face 33, the first auxiliary pole face 29 and the second auxiliary pole face 31 thereby providing a magnetic flux shunt path for a predetermined amount magnetic flux depending upon the thickness of the spacer bracket 41. The spacer bracket 41, in addition to carrying the self-aligned light load adjuster assembly, provides a predetermined spacing between the first voltage shunting member 69 and the first side of the voltage core.

Concluding the description of FIG. 2, a second voltage shunting member 71 is located in magnetic proximity with the main pole face 33, the first auxiliary pole face 29 and the second auxiliary pole face 31 and separated from the first voltage shunting member 69 by a second nonmagnetic spacer 72. The second voltage shunting member 71 has a first fixed tab 73 extending over a portion of the second auxiliary pole face 31 and a second fixed tab 74 located adjacent the movable tab 59. The second voltage shunting member 71 together with the first and second fixed tabs 73 and 74, respectively, provide a fixed magnetic flux shunt path. The multi-function support and spacer bracket 41, the first voltage shunting member 69, the second nonmagnetic spacer 72, the second voltage shunting member 71, the laminae of the voltage core 24 and the power factor bracket 37 all have openings corresponding to the openings 76 of the spacer bracket 41 (shown in FIG. 3) such that all of the components of the voltage magnetic section 12 may be riveted together thereby providing a solid assembly. The voltage magnetic section 12 disclosed herein is easily assembled and extremely resistant to damage due to mechanical shock.

What we claim is:

1. An induction meter including a voltage and a current magnetic section each producing magnetic flux and a rotatable disk driven at a rate responsive to said magnetic flux directed from said magnetic sections into said disk, wherein said voltage magnetic section comprises:

a substantially E-shaped laminated magnetic core having a center leg terminating at a main pole face and two adjacent legs terminating at coplanar auxiliary pole faces on opposite sides of said main pole faces, said first and last laminae defining a first and a second side, respectively, of said core;

a voltage coil wound about said center leg;

a voltage shunting member located in magnetic proximity to said first side for providing a magnetic flux shunt path between said pole faces;

a nonmagnetic spacer located between said first side and said voltage shunting member and lying in a plane substantially parallel to said first side, a portion of said spacer extending beyond one of said adjacent legs in a direction opposite from said center leg and including means for supporting a screw;

a screw carried by said screw support means of said spacer extending portion;

a movable tab having a threaded portion cooperating with said screw, said tab being oriented so as to extend over portions of one of said auxiliary pole faces and said main pole face thereby providing an adjustable magnetic flux shunt path.

2. The meter of claim 1 wherein said screw support means comprises two extensions from said spacer extending portion each having an opening therethrough, and wherein the threaded portion of said screw is located between said extensions.

3. The meter of claim 2 wherein said movable tab has two extensions each having an opening therethrough, one of said tab extensions having threads cooperating with said screw and located between said spacer extensions.

4. The meter of claim 3 including a spring carried by said screw and located between said threaded extension of said movable tab and one of said extensions of said nonmagnetic spacer.

5. The meter of claim 1 wherein said voltage shunting member, said nonmagnetic spacer and said laminae all have corresponding openings therethrough receiving rivets thereby providing a solid assembly.

6. The meter of claim 1 including a second voltage shunting member having a first fixed tab in magnetic proximity to one of said auxiliary pole faces and a second fixed tab in magnetic proximity to said movable tab, and including a second nonmagnetic spacer located between said first and second voltage shunting members.

7. The meter of claim 1 including a power factor bracket extending from said second side of the magnetic core.

8. The meter of claim 7 including a flux return tongue carried by said power factor bracket, said tongue located opposite the main pole face and maintaining a spaced relationship therewith with the disk rotating within said space.

* * * * *